US008264001B2

(12) United States Patent
Sato

(10) Patent No.: US 8,264,001 B2
(45) Date of Patent: Sep. 11, 2012

(54) SEMICONDUCTOR WAFER HAVING MULTI-LAYERED BUFFER REGION FORMED FROM COMPOUND SEMICONDUCTOR MATERIALS

(75) Inventor: Ken Sato, Niiza (JP)

(73) Assignee: Sanken Electric Co., Ltd., Niiza-shi (JP)

( * ) Notice: Subject to any disclaimer, the term of this patent is extended or adjusted under 35 U.S.C. 154(b) by 225 days.

(21) Appl. No.: 12/721,788

(22) Filed: Mar. 11, 2010

(65) Prior Publication Data

US 2010/0237387 A1 Sep. 23, 2010

(30) Foreign Application Priority Data

Mar. 19, 2009 (JP) .................. 2009-069149

(51) Int. Cl.
*H01L 29/15* (2006.01)
(52) U.S. Cl. .. 257/190; 257/191; 257/200; 257/E29.091
(58) Field of Classification Search ............ 257/191
See application file for complete search history.

(56) References Cited

U.S. PATENT DOCUMENTS

| 6,815,722 B2 * | 11/2004 | Lai et al. .................. 257/79 |
| 7,541,232 B2 * | 6/2009 | Robinson et al. ............. 438/172 |
| 7,652,282 B2 * | 1/2010 | Yanagihara .................. 257/19 |
| 2004/0195562 A1 * | 10/2004 | Munns .......................... 257/1 |
| 2006/0118824 A1 * | 6/2006 | Otsuka et al. ................ 257/194 |
| 2006/0237711 A1 * | 10/2006 | Teraguchi .................... 257/14 |

FOREIGN PATENT DOCUMENTS

| JP | 2003-59948 | 2/2003 |
| JP | 2008-205117 | 9/2008 |

* cited by examiner

*Primary Examiner* — Stephen W Smoot
(74) *Attorney, Agent, or Firm* — Oblon, Spivak, McClelland, Maier & Neustadt, L.L.P.

(57) ABSTRACT

A semiconductor wafer includes a substrate, a buffer region formed on one main surface of the substrate and formed from a compound semiconductor, and a main semiconductor region formed in the buffer region and formed from a compound semiconductor, wherein the buffer region includes a first multi-layer structured buffer region and a second multi-layer structured buffer region stacked with a plurality of alternating first layers and second layers, and a single layer structured buffer region arranged between the first multi-layer structured buffer region and the second multi-layer structured buffer region, the first layer is formed from a compound semiconductor which has a lattice constant smaller than a lattice constant of a material which forms the substrate, the second layer is formed from a compound semiconductor which has a lattice constant between a lattice constant of a material which forms the substrate and a lattice constant of a material which forms the first layer, and wherein the single layer structured buffer region is thicker than the first layer and the second layer, and is formed from a compound semiconductor which has a lattice constant between a lattice constant of a material which forms the first layer and a lattice constant of a material which forms the second layer.

10 Claims, 5 Drawing Sheets

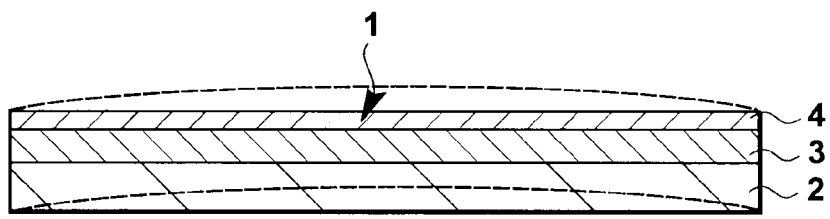
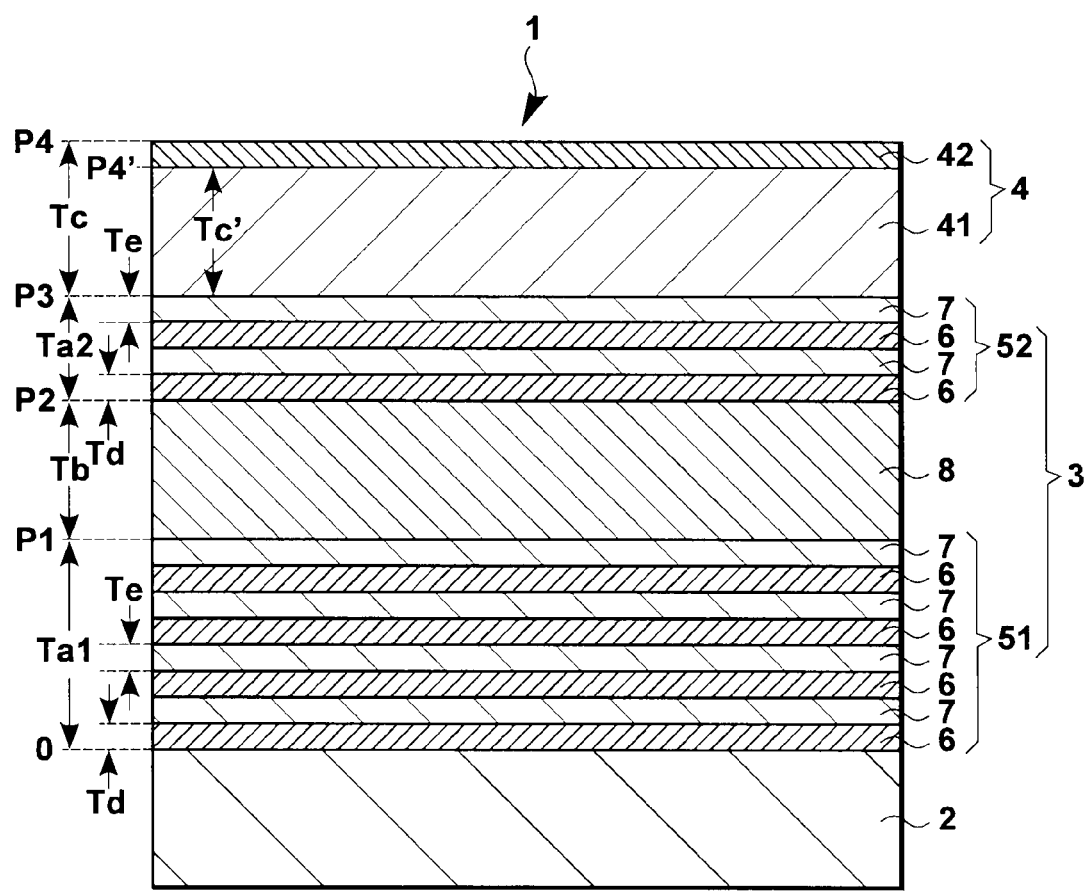

US 8,264,001 B2

SEMICONDUCTOR WAFER HAVING MULTI-LAYERED BUFFER REGION FORMED FROM COMPOUND SEMICONDUCTOR MATERIALS

CROSS REFERENCE TO RELATED APPLICATION

This application is based upon and claims the benefit of priority from the prior Japanese Patent Application No. 2009-069.149 filed on Mar. 19, 2009, the entire contents of which is incorporated herein by reference.

BACKGROUND OF THE INVENTION

1. Field of the Invention

The present invention is related to a semiconductor wafer, semiconductor element and a method of manufacturing the semiconductor element. In particular, the present invention is related to a semiconductor wafer on which a compound semiconductor is formed on a substrate using an epitaxial growth method, and a semiconductor element such as HEMT, SBD (schottky barrier diode) and LED (Light emitting diode) formed using the semiconductor wafer and a method of manufacturing the semiconductor element.

2. Description of the Related Art

A wafer on which a nitride semiconductor is formed using an epitaxial growth method on a substrate (referred to simply as silicon substrate herein) comprised of silicon is disclosed in Japan Laid Open Patent 2003-59948 (Patent Document 1). A silicon substrate has the advantage of low cost compared to a sapphire substrate. However, a linear expansion coefficient of a silicon substrate is approximately $4.70 \times 10^{-6}$/K and the linear expansion coefficient of GaN used as a nitride semiconductor is approximately $5.59 \times 10^{-6}$/K so there is a relatively large linear expansion coefficient between the two. In addition, a lattice constant of silicon and a lattice constant of a nitride semiconductor are mutually different. Also, the linear expansion coefficient and lattice constant of a nitride semiconductor other than GaN are different to the silicon substrate. Consequently, when a nitride semiconductor is formed on a silicon substrate, stress is applied to the nitride semiconductor and cracks or dislocations easily occur.

In order to solve this problem, a technology is disclosed in patent document 1 mentioned above in which a buffer region is arranged on a silicon substrate and the region has a multi-layer structure including a first layer comprised of AlN and a second layer comprised of GaN which are alternately arranged and a nitride semiconductor region for forming semiconductor elements is formed on the buffer region by epitaxial growth. Because this multi-layer structured buffer region has good stress relieving effects, it is possible to reduce cracks or dislocations being generated on the nitride semiconductor region for forming semiconductor elements arranged on the buffer region.

In addition, a technology is disclosed in Japan Laid Open Patent 2008-205117 (Patent Document 2) in which stress is generated on a buffer region or nitride semiconductor for forming semiconductor elements when the nitride semiconductor is formed thickly on a substrate using an epitaxial growth method and warping generated on the semiconductor wafer due to this stress is reduced.

The buffer region of the semiconductor wafer disclosed in Patent Document 2 is formed by a plurality of multi-layer structured buffer regions disclosed in Patent Document 1 and a single layer structured buffer region which is alternately arranged between the plurality of multi-layer structured buffer regions. Specifically, a plurality of multi-layer structured buffer regions in which the first layer comprised of AlN and the second layer comprised of GaN are alternately arranged, and a single layer structured buffer region comprised of GaN formed thicker than the second layer and arranged alternately between the plurality of multi-layer structured buffer regions is disclosed in Patent Document 2.

However, in the technology disclosed in Patent Document 2, piezo polarization occurs within the single layer structured buffer region due to stress caused by the difference between the lattice constant of a material which forms the first layer comprised of AlN of a multi-layer structured buffer region and the lattice constant which forms the single layer structured buffer region comprised of GaN, and the single layer structured region suffers from low resistivity. In addition, the single layer structured region suffers from low resistivity due to defects caused by nitrogen holes generated within the single layer structured region. As a result, a current flows easily in a horizontal direction within the single layer structured region which is formed thickly and causes a problem whereby parasitic capacitance generated within the buffer region becomes large.

SUMMARY OF THE INVENTION

Therefore, the present invention provides a semiconductor wafer, a semiconductor element and a manufacturing method thereof which can form a compound semiconductor thickly on a substrate and which can reduce parasitic capacitance generated within a buffer region.

In order to solve the above described problems, a first feature related to an embodiment of the present invention is a semiconductor wafer which includes a substrate, a buffer region formed on one main surface of the substrate and formed from a compound semiconductor, and a main semiconductor region formed in the buffer region and formed from a compound semiconductor, wherein the buffer region includes a first multi-layer structured buffer region and a second multi-layer structured buffer region stacked with a plurality of alternating first layers and second layers, and a single layer structured buffer region arranged between the first multi-layer structured buffer region and the second multi-layer structured buffer region, and the first layer is formed from a compound semiconductor which has a lattice constant smaller than a lattice constant of a material which forms the substrate, and the second layer is formed from a compound semiconductor which has a lattice constant between a lattice constant of a material which forms the substrate and a lattice constant of a material which forms the first layer, and the single layer structured buffer region has a thicker film thickness than a film thickness of the first layer and the second layer, and is formed from a compound semiconductor which has a lattice constant between a lattice constant of a material which forms the first layer and a lattice constant of a material which forms the second layer.

In addition, in order to solve the above described problems, a semiconductor element of the present invention includes a substrate, a buffer region formed on one main surface of the substrate and formed from a compound semiconductor, a main semiconductor region formed in the buffer region and formed from a compound semiconductor, and an electrode arranged on the main semiconductor region, wherein the buffer region includes a first multi-layer structured buffer region and a second multi-layer structured buffer region stacked with a plurality of alternating first layers and second layers, and a first single layer structured buffer region arranged between the first multi-layer structured buffer region and the second multi-layer structured buffer region, and wherein the first layer is formed from a compound semiconductor which has a lattice constant smaller than a lattice constant of a material which forms the substrate, and wherein the second layer is formed from a compound semiconductor which has a lattice constant between a lattice constant of a material which forms the substrate and a lattice constant of a material which forms the first layer, and wherein the first single layer structured buffer region has a thicker film thickness than a film thickness of the first layer and the second layer, and is formed from a compound semiconductor which has a lattice constant between a lattice constant of a material which forms the first layer and a lattice constant of a material which forms the second layer.

In addition, in order to solve the above described problems, a method of manufacturing a semiconductor element includes forming a first multi-layer structured buffer region which is stacked with a plurality of alternating first layers and second layers, the first layers being formed from a compound semiconductor having a smaller lattice constant than a lattice constant of a material of a substrate, the second layers being forming from a compound semiconductor having a lattice constant between a lattice constant of a material which forms the substrate and a lattice constant of a material which forms the first layers, first multi-layer structured buffer region being formed on one main surface of the substrate, forming a single layer structured buffer region on the first multi-layer structured buffer region, the first single layer structured buffer region having a thicker film thickness than the first layer and the second layer, and being formed from a compound semiconductor which has a lattice constant between a lattice constant of a material which forms the first multi-layer structured buffer region and a lattice constant of a material which forms second the multi-layer structured buffer region, forming the second multi-layer structured region stacked alternately with a plurality of the first layers and the second layers on the first multi-layer structured buffer region, and forming a buffer region which includes the first multi-layer structured buffer region, the first single layer structured buffer region and the second multi-layer structured buffer region, forming a main semiconductor region formed from a compound semiconductor on the buffer region, and forming an electrode on the main semiconductor region.

BRIEF DESCRIPTION OF THE DRAWINGS

FIG. 1 is a cross sectional diagram which approximately shows a semiconductor wafer related to a first embodiment of the present invention.

FIG. 2 is a cross sectional diagram which shows the semiconductor of FIG. 1 in detail.

DETAILED DESCRIPTION OF THE INVENTION

Figure 3:
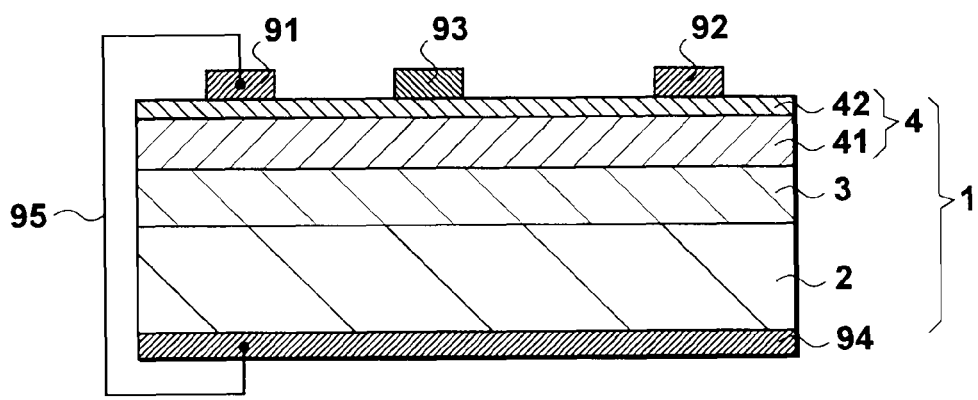
FIG. 3 is a cross sectional diagram which approximately shows a HEMT formed based on the semiconductor of FIG. 1.

Next, the embodiments of the present invention will be explained while referring to the drawings. Like or corresponding parts are denoted by like or corresponding reference numerals. The drawings are schematic, and may sometimes differ from actual components. Further, dimensions and ratios of components may be different between drawings.
(First Embodiment)
[Structure of a Semiconductor Wafer and Semiconductor Element]

As is approximately shown in FIG. 1, a semiconductor wafer 1 for forming a high electron mobility transistor, HEMT, as a semiconductor element related to the first embodiment of the present invention includes a substrate 2 comprised of silicon, a buffer region 3 which is arranged on one main surface of the substrate 2 and which is formed using a nitride semiconductor, and a main semiconductor region 4 for forming semiconductor elements arranged on the buffer region 3 and formed using a nitride semiconductor. This semiconductor wafer 1 includes an area in which a plurality of HEMT (a plurality of semiconductor chips) can be manufactured.

The substrate 2 has a thickness of, for example, 350 um-1000 um and is comprised of a single crystal silicon having a larger (for example 0.543 nm) lattice constant than the buffer region 3 and main semiconductor region 4, and a smaller linear expansion coefficient (for example, $4.70 \times 10^{-6}$/K) than a linear expansion coefficient (for example, $5.60 \times 10^{-6}$/K) of the buffer region 3 and a linear expansion coefficient (for example, $5.59 \times 10^{-6}$/K) of the main semiconductor region 4. This substrate 2 functions as a growth substrate of the buffer region 3 and the main semiconductor region 4 and as a mechanical support substrate. It is possible to add impurities to the substrate 2 which determine the conductivity, either n type or p type, according to necessity. In addition, it is possible to use a silicon compound substrate such as SiC or a sapphire substrate as the substrate 2.

FIG. 2 shows an enlarged view in a thickness direction of the semiconductor wafer in FIG. 1 and a partial enlarged view of the semiconductor wafer 1 showing in detail the buffer region 3 and main semiconductor region 4. Furthermore, the thickness of the substrate 2, buffer region 3 and main semiconductor region 4 shown in FIG. 1 and FIG. 2 is different to an actual thickness.

The buffer region 3 includes a first multi-layer structured buffer region 51 and a second multi-layer structured buffer region 52 shown in FIG. 2. Each of the first multi-layer structured buffer region 51 and second multi-layer structured buffer region 52 are comprised from a first layer 6 and a second layer 7 which are stacked alternately in a film thickness direction as is shown in FIG. 2. In the example shown in FIG. 2, the first multi-layer structured buffer region 51 is comprised by stacking a pair of the first layer 6 and second layer 7 in four layers and the second multi-layer structured buffer region 52 is comprised by stacking a pair of the first layer 6 and second layer 7 in 2 layers. Furthermore, in the first embodiment, the number of pairs of first layer 6 and second layer 7 of the first multi-layer structured buffer region 51 and the number of pairs of first layer 6 and second layer 7 of the second multi-layer structured buffer region 52 is not limited to this example and can be arbitrarily changed. For example, the number of pairs of first layer 6 and second layer 7 of the second multi-layer structured buffer region 52 may be the same as the number of pairs of first layer 6 and second layer 7 of the first multi-layer structured buffer region 51. However, in order to reduce the maximum level of warping of the semiconductor wafer 1, a lower number of pairs of first layer 6 and second layer 7 of the second multi-layer structured buffer region 52 than the number of pairs of first layer 6 and second layer 7 of the second multi-layer structured buffer region 51 is preferred.

In the first multi-layer structured buffer region 51, the number of preferred number of pairs of the first layer 6 and the second layer 7 is 4-50. In the second multi-layer structured buffer region 52, the preferred number of pairs of the first layer 6 and the second layer 7 is 2-30. In the case where the number of pairs of the first layer 6 and second layer 7 in the first multi-layer structured buffer region 51 is less than 4, or in the case where the number of pairs of the first layer 6 and second layer 7 in the second multi-layer structured buffer region 52 is less than 2, or in the case where the number of pairs of the first layer 6 and second layer 7 in the first multi-layer structured buffer region 51 is larger than 50, or in the case where the number of pairs of the first layer 6 and second layer 7 in the second multi-layer structured buffer region 52 is larger than 30, warping of the semiconductor wafer 1 can no longer be improved sufficiently.

In FIG. 2, the thickness Ta1 of the first multi-layer structured buffer region 51 is larger than the thickness Ta2 of the second multi-layer structured buffer region 52. However, the thickness Ta1 and Ta2 may be the same or arbitrarily adjusted according to a change in the number of pairs stated above.

A material having a lower lattice constant of a material which forms the substrate 2 and a relatively high level of insulation properties is used in the first layer 6. For example, a nitride semiconductor represented by the chemical formula (1) where the proportion of contained aluminum is a first proportion is used.

$$Al_xM_yGa_{1-x-y}N \quad (1)$$

Here, M in the chemical formula (1) is an element selected from at least one among In (indium) and B (boron). In addition, x and y are numerical values which satisfy the relational expression below.

$$0<x\leq1$$

$$0\leq y<1$$

$$x+y\leq1$$

That is, the first layer 6 is comprised from a nitride semiconductor material selected from one of, for example, AlN (aluminum nitride), AlInN (aluminum indium nitride), AlGaN (aluminum gallium nitride) and AlInGaN (aluminum indium gallium nitride). Furthermore, the first layer 6 can be doped with impurities which determine the conductivity, n type or p type. The thickness Td of the first layer 6 is preferred to be 0.5 nm-20.0 nm. In the case where the thickness Td of the first layer 6 is thinner than 0.5 nm and thicker than 20.0 nm, the effects of reducing warping of the semiconductor wafer 1 and improvement of crystallization of the main semiconductor region 4 are reduced.

In the first embodiment, the first layer is AlN and the thickness Td is set at 5 nm. All the first layer 6 shown in FIG. 2 in the first embodiment are formed using the same material (AlN). In addition, in the first embodiment, a plurality of first layers 6 may be alternately formed using a different material. All of the first layers 6 shown in FIG. 2 are formed to the same thickness in the first embodiment. In addition, in the first embodiment, a plurality of first layers 6 may be alternately formed to a different thickness. A lattice constant of a crystal axis a and c of the first layer 6 has a lower value (for example, axis a of 0.311 nm and axis c of 0.498 nm) than the lattice constant of the substrate 2 comprised of silicon. In addition, the linear coefficient expansion of the first layer 6 has a larger value (for example, $5.64\times10^{-6}$/K) than the linear expansion coefficient of the substrate 2.

The second layer 7 which is arranged on the first layer 6 has a lattice constant between a lattice constant of a material which forms the substrate 2 and a lattice constant of a material which forms the first layer 6. For example, a nitride semiconductor represented by the chemical formula (2) where the proportion of contained aluminum is a second proportion (including zero) is used.

$$Al_aM_bGa_{1-a-b}N \quad (2)$$

Here, M in the chemical formula (2) is an element selected from at least one among In and B. In addition, a and b are numerical values which satisfy the relational expression below.

$$0\leq a\leq1$$

$$0\leq b<1$$

$$a+b\leq1$$

$$a<x$$

That is, the second layer 7 has a lattice constant between a lattice constant of a material which forms the substrate 2 and a lattice constant of a material which forms the first layer 6, a lower band gap of a material which forms the first layer 6, and a material which has relatively lower level of insulation properties than the first layer 6. The second layer 7 is comprised of a nitride semiconductor material selected from one of GaN (gallium nitride), InGaN (indium gallium nitride), AlInN, AlGaN which has a lower ration of contained Al than the first layer 6, and AlInGaN. Furthermore, the second layer can be doped with impurities which determine the conductivity, n type or p type, according to necessity. The thickness Te of the second layer 7 is preferred to be 1 nm-50 nm. In the case where the thickness Te of the second layer 7 is thinner than 1 nm or thicker than 50 nm, the effects of reducing warping of the semiconductor wafer 1 and improvement of crystallization of the main semiconductor region 4 are reduced. In the first embodiment, the second layer 7 is formed from GaN which has a narrower band gap energy than the first layer 6 and a lower resistivity than the first layer 6. The thickness Te of the second layer 7 is set at 3.5 nm.

Furthermore, all of the second layers 7 shown in FIG. 2 are formed using the same material (GaN) in the first embodiment. In addition, a plurality of second layers 7 can be alternately formed using a different material. All of the second layers 7 shown in FIG. 2 are formed to the same thickness in the first embodiment. In addition, a plurality of second layers 7 can be alternately formed to a different thickness. In addition, because aluminum is not an essential component, it is not necessary to include aluminum in the second layer 7.

Therefore, in the second layer 7, the second proportion of aluminum is a predetermined value which includes zero. Furthermore, because it is possible to increase the level of resistance of the second layer 7 by including aluminum, it is preferred to include aluminum in the second layer 7. The lattice constant of a crystal axis a and c of the second layer 7 is larger than the lattice constant of the first layer 6, and has a smaller value than the lattice constant of the substrate 2 (for example, axis a 0.318 nm, axis c 0.518 nm). In addition, the linear expansion coefficient of the second layer 7 has a larger value (for example, $5.59 \times 10^{-6}$/K) than the linear expansion coefficient of the substrate 2.

A single layer structured buffer region 8 is arranged between the first multi-layer structured buffer region 51 and the second multi-layer structured buffer region 52. The single layer structured buffer region 8 is comprised of a material which has a lattice constant between the lattice constant of a material which forms the first layer 6 and the lattice constant of a material which forms the second layer 7, for example, a nitride semiconductor represented by the chemical formula (3) where the proportion of contained aluminum is a third proportion between the first proportion and the second proportion is used.

$$Al_h M_k Ga_{1-h-k} N \qquad (3)$$

Here, M in the chemical formula (3) is an element selected from at least one among In and B. In addition, h and k are numerical values which satisfy the relational expression below.

$$0 < h < 1$$

$$0 \leq k < 1$$

$$h + k \leq 1$$

$$a < h < x$$

Furthermore, the single layer structured buffer region 8 can be doped with impurities which determine the type of conductivity, n type of p type, according to necessity. In addition, in the first and second multi-layer structured buffer regions 51, 52, an extra first layer 6 is stacked on a stacked layer body which is stacked alternately with the first layer 6 and second layer 7 and top of this the single layer structured buffer region 8 may be formed.

In the case of including the first layer 6 of the uppermost layer of the first and second multi-layer structured buffer region 51, 52 in the first and second multi-layer structured buffer regions 51, 52, the total number of first layers 6 included in the first and second multi-layer structured buffer regions 51, 52 is one layer larger than the total number of second layers 7.

The single layer structured buffer region 8 has a thickness Tb which is larger than the thickness Td of the first layer 6 and the thickness Te of the second layer 7. It is preferred that the thickness Tb of the single layer structured buffer region 8 is formed thicker than the sum of the thickness Td of the first layer 6 and the thickness Te of the second layer 7. For example, it is preferred that the thickness Tb of the single layer structured buffer region 8 is set at 20 nm-400 nm. In the case where the thickness Tb of single layer structured buffer region 8 is thinner than 20 nm and thicker than 400 nm, the effects of reducing warping of the semiconductor wafer 1 and improvement of crystallization of the main semiconductor region 4 are reduced. In the first embodiment, the single layer structured buffer region 8 is comprised of AlGaN and the thickness Tb is set at 200 nm.

Furthermore, the lattice constant of a crystal axis a and c of the single layer structured buffer region 8 is a lattice constant seen on average (or macroscopically). In addition, in the case where an extra first layer 6 is stacked on a stacked body in which the first layer 6 and second layer 7 are alternately stacked as the first multi-layer structured buffer region 51, as the single layer structured buffer region 8 gets further from the substrate 2 (the direction in which the thickness of the buffer region 3 on the substrate 2 increases), the lattice constant may gradually approach the lattice constant of the second layer 7 from the first layer 6. For example, in the case where the single layer structured buffer region 8 is comprised of AlGaN, the ratio of Al contained in the single layer structured buffer region 8 may be gradually reduced as it gets further from the substrate 2. In this case, it is possible to further relieve the stress caused by arranging the single layer structured buffer region 8 and further increase the film thickness of the semiconductor wafer 1.

Furthermore, because it is possible t reduce piezo polarization caused by stress generated in the single layer structured buffer region 8, and reduce the amount of current which flows in a horizontal direction generated in the single layer structured buffer region 8, it is possible to reduce parasitic capacitance within the buffer region 3.

The second multi-layer structured buffer region 52 which is arranged on the single layer structured buffer region 8 is comprised from a stacked body in which the first layer 6 and second layer 7 are alternately stacked the same as the first multi-layer structured buffer region 51. Apart from the number of pairs of first layers 6 and second layers 7 being different and the entire thickness Ta2 being different to the first multi-layer structured buffer region 51, the second multi-layer structured buffer region 52 is formed with the same structure as the first multi-layer structured buffer region 51.

Furthermore, the material which forms either one of both of the first layer 6 and second layer 7 within the second multi-layer structured buffer region 52 can be replaced within a range which satisfies the condition where the proportion of Al contained in the second multi-layer structured buffer region 52 seen on average is larger than the single layer structured buffer region 8, and the condition where the lattice constant seen on average of the second multi-layer structured buffer region 52 is smaller than the single layer structured buffer region 8. In addition, the number of pairs of first layer 6 and second layer 7 in the second multi-layer structured buffer region 52 can be set the same as the number of pairs in the first multi-layer structured buffer region 52 as stated above.

In the first embodiment, the main semiconductor region 4 shown in FIG. 1 is comprised of An electron transport layer 41 comprised from non-impurity doped (undoped) GaN and an electron transport layer 42 comprised from non-impurity doped $Al_{02}Ga_{08}$ In order to form a HEMT for example. Furthermore, an electron supply layer 42 may be doped with n type impurities.

The electron transport layer 41 which is arranged on the buffer region 3 is also called a channel layer and the thickness of the electron transport layer 41 is set at 1800 nm for example. The electron supply layer 42 which is arranged on the first electron transport layer 41 has a function for generating a two-dimensional carrier gas layer (2 dimensional electron gas layer: 2DEG) on the electron transport layer 41 by piezo polarization based on a hetero junction between the electron supply layer 42 and electron transport layer 41.

The electron supply layer which includes Al is extremely thin compared to the electron transport layer 41 which does not include Al. Therefore, the proportion of Al seen on average in the main semiconductor region 4 and the proportion of Al in the electron transport layer 41 becomes almost the same, and the proportion of Al in the main semiconductor region 4 is smaller than the proportion of Al in the first and second multi-layer structured buffer regions 51, 52. The lattice constant seen on average of the main semiconductor region 4 becomes almost the same as the lattice constant of the electron transport layer 41, the lattice constant of the main semiconductor region 4 is larger than the lattice constant of the first and second multi-layer structured buffer regions 51, 52 and smaller than the lattice constant of the substrate 2.

The lattice constant in the crystal axis a and c of the electron transport layer 41 which makes up the majority of the main semiconductor region 4 is, for example, 0.318 nm in the axis a and 0.518 nm in the axis c and is larger than the lattice constant of the first layer 6.

The linear expansion coefficient of the thick electron transport layer 41 of the main semiconductor region 4 and the linear expansion coefficient of the thin electron supply layer 42 and the linear expansion coefficient seen on average macroscopically of the main semiconductor region 4 are larger than the linear expansion coefficient of the substrate 2 and the linear expansion coefficient of the first layer 6. Therefore, in the case where the substrate 2 is not considered, that is, when the substrate 2 is ignored, if the stress of the main semiconductor region 4 is observe, the same compression stress as the single layer structured buffer region 8 is generated in the main semiconductor region 4 seen macroscopically.

FIG. 3 is a cross sectional diagram which approximately shows a HEMT manufactured using the semiconductor wafer 1 shown in FIG. 1 and FIG. 2. The same symbols are used for the same structural components in FIG. 3 as in FIG. 1 and thus any overlapping explanations are omitted here. In the HEMT, a source electrode 91 as a first electrode and a drain electrode 92 as a second electrode are connected via an ohmic (low resistance) connection to the electron supply layer 42 and a gate electrode 93 as a control electrode is connected to the electron supply layer 42 via a short key connection. Furthermore, it is possible to arrange an n type contact layer with a high concentration of impurities between the electron supply layer 42 and the source electrode 91, drain electrode 92. In addition, the gate electrode 93 may have a MIS (Metal Insulator Semiconductor) structure. A supporting electrode 94 is arranged on the bottom surface of the substrate 2 in order to realize stability of the operation of the HEMT and the supporting electrode 94 is connected to the source electrode via a conductor 95. In the HEMT shown in FIG. 3, pressure resistance between the drain electrode 92 and the supporting electrode 94 arranged on the bottom surface of the substrate 2 is important. Because the substrate 2 is a silicon semiconductor, pressure resistance can not be expected to be maintained in the substrate 2. Thus, in the first embodiment, pressure resistance is improved by forming the buffer region 3 and main semiconductor region 4 thickly.

[Manufacturing Method of the Semiconductor Wafer]

An example of a manufacturing method of the semiconductor wafer 1 shown in FIG. 1 and FIG. 2 is as follows.

First, a silicon substrate 2 which includes a main surface which is a surface (111) in crystal plane direction expressed by a mirror index is prepared.

Next, the substrate 2 is inserted into a reaction chamber of a MOCVD (Metal Organic Chemical Vapor Deposition) device. In the reaction chamber, TMA (trimethyl aluminum) and ammonia is supplied to the reaction chamber after an oxide film is removed from the surface of the substrate 2, and the first layer 6 comprised from AlN (nitride aluminum) is formed on the silicon substrate 2 using an epitaxial growth method. Following this, the supply of TMA is stopped, the supply of ammonia is continued, TMG (trimethyl gallium) is supplied to the reaction chamber together with the ammonia, and the second layer 7 comprised of GaN is formed on the first layer 6 using the epitaxial growth method. The formation process of the first layer 6 and the second layer 7 is repeated alternately a desired number of times and the first multi-layer structured buffer region 51 is formed.

Next, a single layer structured buffer region 8 comprised of AlGaN is formed using an epitaxial growth method on the first multi-layer structured buffer region 51 at a film thickness thicker than the first layer 6 and the second layer 7.

In the formation of the single layer structured buffer region 8, ammonia is supplied to the reaction chamber at the same time as TMA (trimethyl aluminum) which is supplied to the reaction chamber at a smaller supply amount than the time when the first layer 6 is formed and at a supply time longer than the when the first layer 6 is formed.

Next, the second multi-layer structured buffer region 52 is formed using the same formation method as the first multi-layer structured buffer region 51. When the second multi-layer structured buffer region 52 is formed the buffer region can be completed.

Following this, the main semiconductor region 4 is formed using the known epitaxial growth method. As a result, the semiconductor wafer 1 is completed.

Furthermore, in the case where a HEMT is manufactured using the semiconductor wafer 1, a source electrode 91 comprised of titanium (Ti)/gold (Au) as a first electrode and a drain electrode 92 comprised of titanium/gold as a second electrode are formed on the main semiconductor region 4 using a vapor deposition method. Then, a gate electrode 93 which performs the role of a short key connection is formed on the electron supply layer 42 between the source electrode 91 and the drain electrode 92. When the gate electrode 93 is formed the HEMT shown in FIG. 3 is complete.

Figure 4:
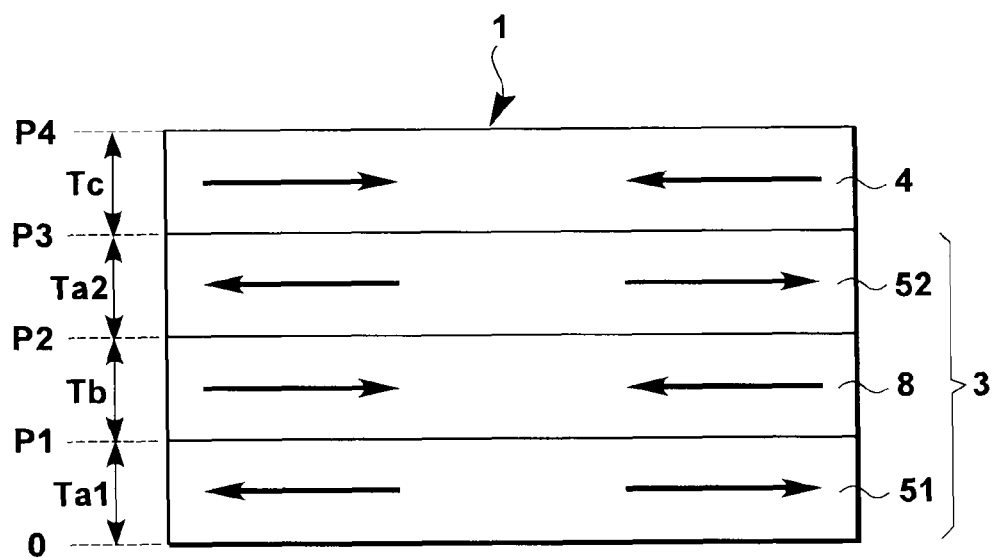
FIG. 4 is a diagram which shows the relationship between the thickness of a main semiconductor region and buffer region and warping for explaining warping.
Figure 5:
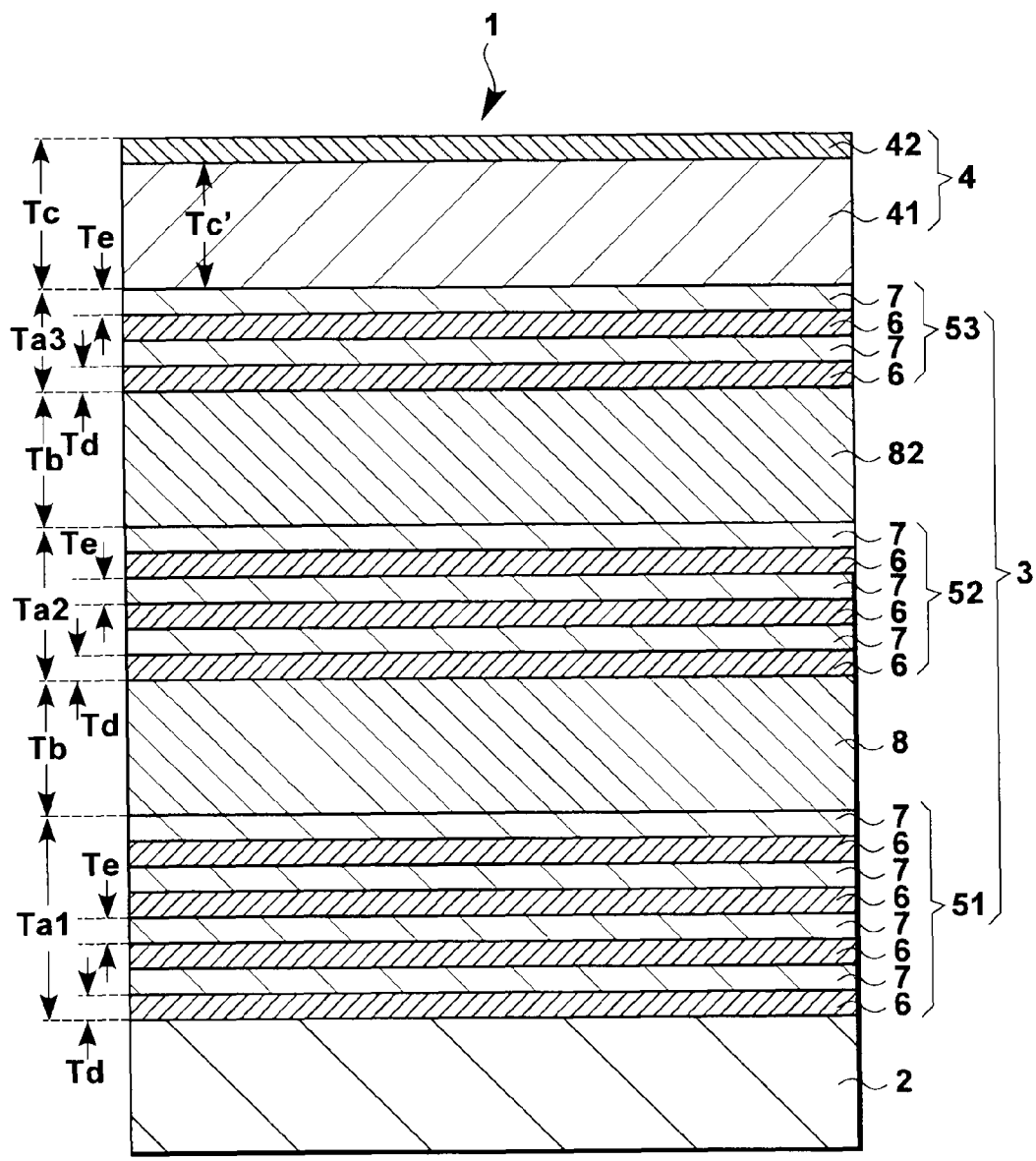
FIG. 5 is a cross sectional diagram which approximately shows a semiconductor wafer related to a second embodiment of the present invention.

FIG. 4 is a diagram which shows approximately the generation state of stress (warping force) which occurs on each of the first multi-layer structured buffer region 51, the second multi-layer structured buffer region 52, the single layer structured buffer region 8 and the main semiconductor region 4 in the case where the substrate 2 is not considered (when the stress on the substrate 2 is ignored). The first multi-layer structured buffer region 51 and the second multi-layer structured buffer region 52 include a plurality of first layers 6 and second layers 7 as is shown in FIG. 2. However, the proportion of Al in the first and second multi-layer structured buffer regions 51, 52 seen on average is larger than the single layer structured buffer region 8 and the lattice constant of the first and second multi-layer structured buffer regions 51, 52 seen on average is smaller than the single layer structured buffer region 8. From this type of reason, as is shown in FIG. 5, tension stress is generated as shown by the outward pointing arrow in the first and second multi-layer structured buffer regions 51, 52. Compression stress is generated as is shown by the inward pointing arrow in shown in FIG. 5 in the single layer structured buffer region 8 and the main semiconductor region 4 which has a larger lattice constant seen on average than the first and second multi-layer structured buffer regions 51, 52. In other words, if the stress of each region of the first and second multi-layer structured buffer regions 51, 52, the single layer structured buffer region 8, and the main semiconductor region 4 is adjusted appropriately, the tension stress and compression stress are cancelled out and it is possible to reduce warping of the semiconductor wafer 1. Furthermore, because the single layer structured buffer region 8 is not formed using a material (for example, AlGaN) which has a lattice constant between the lattice constant of the first layer 6 and the lattice constant of the second layer 7, stress in the single layer structured buffer region 8 becomes smaller compared to the case where the single layer structured buffer region 8 is formed using GaN. Furthermore, it is possible to increase the stress relieving effects in the buffer region 3.

In addition, in the case where the substrate 2 is not considered (when the stress on the substrate 2 is ignored) it is necessary to consider the effects of the substrate 2 on the buffer region 3 and main semiconductor region 4 and the stress state shown in FIG. 5 is not always obtained. However, in the semiconductor wafer 1 related to the first embodiment, the single layer structured buffer region 8 is arranged, and because the stress which is generated in the first and second multi-layered structured buffer regions 51, 52, single layer structured buffer region 8 and main semiconductor region 4 is relieved, it is possible to form the semiconductor wafer 1 with a thicker film thickness.

As is clear from the description above, the following effects can be obtained from the semiconductor wafer 1 and semiconductor elements related to the first embodiment and the manufacturing method thereof.

(1) It is possible to reduce stress generated in the single layer structured buffer region 8 by arranging a single layer structured buffer region 8 comprised from a compound semiconductor which has a lattice compound between the lattice constant of a material which formed the first layer 6 and a lattice constant of a material which forms the second layer 7. As a result, it is possible to reduce the generation of piezo polarization within the single layer structured buffer region 8 and because it is possible to reduce a current component which is generated in a horizontal direction of the single layer structured buffer region 8, it is possible to reduce parasitic capacitance which occurs within the buffer region 3. Therefore, if a switching element is formed using the semiconductor wafer 1 related to the first embodiment, it is possible to improve switching speed.

Furthermore, because AlGaN which has a higher resistance than GaN is used in the single layer structured buffer region 8 which is formed thicker than the first layer 6 and second layer 7, it is possible to further reduce the current component in a horizontal direction of the single layer structured buffer region 8 and reduce parasitic capacitance which is generated within the buffer region 3.

(2) It is possible to form the semiconductor wafer 1 thicker because it is possible to relieve stress of the entire buffer region 3 by arranging the single layer structured buffer region 8 which is comprised from a material which has a lattice constant between a lattice constant of a material which forms the first layer 6 and a lattice constant of a material which forms the second layer 7, between the first multi-layer structured buffer region 51 and the second multi-layer structured buffer region 52. Therefore, it is possible to improve insulation properties in a vertical direction in the semiconductor wafer 1.

Furthermore, because it is possible to reduce stress which is generated in the second layer 7 and the single layer structured buffer region 8, and reduce the generation of piezo polarization within the single layer structured buffer region 8, and reduce the current component in a horizontal direction of the single layer structured buffer region 8, it is possible to reduce parasitic capacitance which is generated within the buffer region 3. Therefore, if a switching element is formed using the semiconductor wafer 1 related to the first embodiment, it is possible to improve switching speed.

(3) It is possible to improve warping of the semiconductor wafer 1 and form the thickness of the buffer region 3 and main semiconductor region 4 thicker by using a material in the single layer structured buffer region 8 which has a lattice constant between a lattice constant of a material which forms the first layer 6 and a lattice constant of a material which forms the second layer 7. As a result, it is possible to improve the insulation characteristics in a thickness direction of the semiconductor wafer 1.

(4) It is possible to reduce the stress added to the main semiconductor region 4 by arranging the single layer structured buffer region 8 and reduce the generation of cracks in the main semiconductor region 4.

(5) it is possible to finely set the adjustment of stress generated in the first and second multi-layer structured buffer regions 51, 52 by adjusting at least the composition or thickness of the second layer 7. In addition, it is possible to increase the resistance level of the second layer 7 and reduce parasitic capacitance generated within the buffer region 3 by including aluminum in the second layer 7.

(6) It is possible to reduce the generation of cracks in each of the first and second multi-layer structured buffer regions 51, 52 compared to the buffer region 8 which is formed by just one layer because each of the first and second multi-layer structured buffer regions 51, 52 has a structure in which comparatively thin first layers 6 and second layers 7 are alternately stacked, and it is possible to set the thickness of the buffer region 3 thicker.

(Second Embodiment)

The semiconductor wafer 1, semiconductor elements and manufacturing method thereof related to the second embodiment are as follows. Furthermore, in the embodiments used herein including FIG. 5 and those thereafter, the structural components which are essentially the same as those shown in the FIG. 1 to FIG. 4 components have the same reference symbols and therefore any overlapping explanations are omitted.

As is shown in FIG. 5, the semiconductor wafer 1 related to the second embodiment is arranged with a second single layer structured buffer region 82 and a third multi-layer structured buffer region 53 between the second multi-layer structured buffer region 52 and main semiconductor region 4 shown in FIG. 2. The structure of the semiconductor wafer 1 apart from this is the same as the structure of the semiconductor wafer 1 shown in FIG. 2.

In the semiconductor wafer 1 shown in FIG. 5, an additional second single layer buffer region 82 included in the buffer region 3 is arranged between the second multi-layer structured buffer region 52 and third multi-later structured buffer region 53. The second single layer structured buffer region 82 is formed using the same material as the single layer structured buffer region (first single layer structured buffer region) 8, and here has essentially the same thickness Tb as the thickness Tb of the single layer structured buffer region 8. Furthermore, it is possible to add a difference between the thickness Tb of the single layer structured buffer region 8 and the thickness Tb of the single layer structured buffer region 82. In addition, it is possible to form the single layer structured buffer region 8 and single layer structured buffer region 82 from a different material. For example, it is possible to reduce the proportion of aluminum (fourth proportion) contained in a material which forms the second single layer structured buffer region 82 compared to the proportion of aluminum contained in a material which forms the single layer structured buffer region 8. It is possible to further relieve stress and easily form a thick film of the buffer region 3 by setting this proportion.

The number of pairs of the first layer 6 and the second layer 7 of the second multi-layer structured buffer layer 52 shown in FIG. 5 is three which is one more than the number of pairs in the second multi-layer structured buffer region 52 shown in FIG. 2. The number of pairs of first layer and second layer 7 of the third multi-layer structured buffer region 53 shown in FIG. 5 is two. Therefore, the number of pairs of first layer 6 and second layer 7 in each of the first, second and third multi-layer structured buffer regions 51, 52, and 53 becomes smaller the further away from the substrate 2.

The third multi-layer structured buffer region 53 is formed by essentially the same structure as the first and second multi-layer structured buffer regions 51, 52, and in this example, has a thinner thickness Ta3 than the first and second multi-layer structured buffer regions 51, 52. Furthermore, the thickness of the first, second and third multi-layer structured buffer regions 51, 52, 53 may be the same. In addition, the number of pairs of the first layer 6 and the second layer 7 which form the first, second and third multi-layer structured buffer regions 51, 52, 53 may be the same. Also, the plurality of first layers 8 (sub multi-layer structured buffer region) which form the first, second and third multi-layer structured buffer regions 51, 52, 53, do not have to be of the same material. They can be formed by different materials within the range where the effects of the present invention are obtained. In addition, the plurality of second layers 7 which form the first, second and third multi-layer structured buffer regions 51, 52, 53 do not have to be formed with the same material or set at the same thickness. They can be formed with different materials or different thicknesses within a range where the effects of the present invention can be obtained.

In addition, it is possible to further stack once or repeatedly a multi-layer buffer region with the same as the single multi-layer structured buffer region 82 and the third multi-layer structured buffer region 53 on the third multi-layer structured buffer region 52 shown in FIG. 5.

Figure 6:
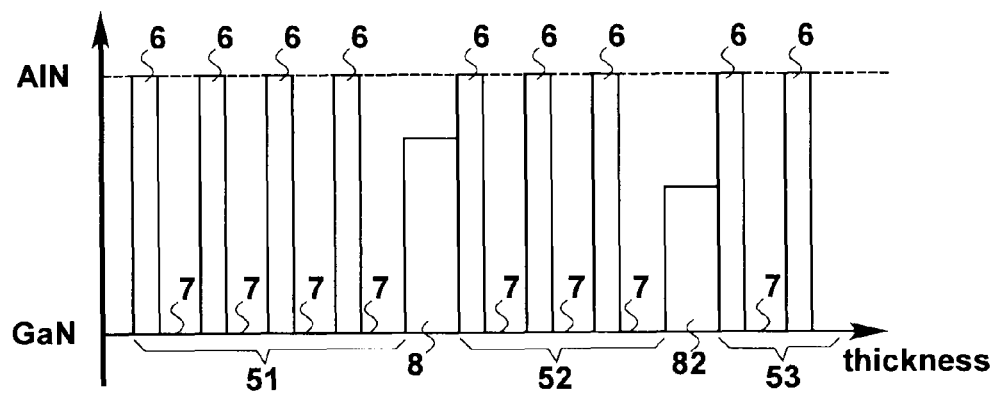
FIG. 6 is a diagram which shows one example where the proportion of Al contained in a material which forms a single layer structured buffer region in the buffer region of the semiconductor wafer related to the second embodiment of the present invention is changed.

Here, it is preferred that a plurality of single layer structured buffer regions sandwiched between the multi-layer structured buffer regions are arranged, and the plurality of single layer structured buffer regions approach the lattice constant of the second layer 7 as it gets further away from the substrate 2. For example, FIG. 6 shows the composition proportion of Al in each layer (first layer 6, second layer 7, single layer structured buffer region 8, second single layer structured buffer region 82) of the buffer region 3 with an upper surface of the substrate 2 as a standard on a horizontal axis. By setting the contained proportion of Al in a material which forms the single layer structured buffer region 8 larger than that of the second single layer structured buffer region 82, the stress generated in the buffer region is relieved and it becomes easier to realize a thick filmed semiconductor wafer 1.

Figure 7:
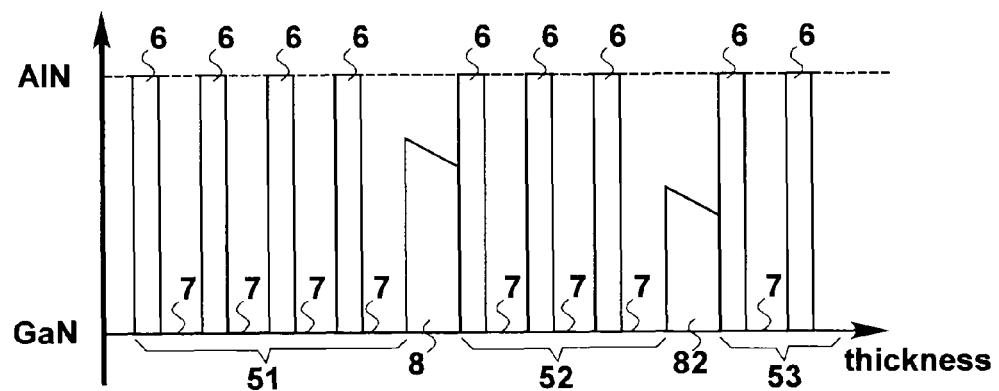
FIG. 7 is a diagram which shows another example where the proportion of Al contained in a material which forms a single layer structured buffer region in the buffer region of the semiconductor wafer related to the second embodiment of the present invention is changed.

In addition, FIG. 7 shows the composition proportion of Al when the thickness of each layer (first layer 6, second layer 7, single layer structured buffer region 9, second single layer structured buffer region 82) of the buffer region 3 with an upper surface of the substrate 2 as a standard on a horizontal axis is considered. It is preferred that the lattice constant of the single layer structured buffer region approaches the lattice constant of the second layer 7 as it gets further away from the substrate 2 (heading in a thickness direction). For example, as is shown in FIG. 7, by gradually lowing the ratio of Al contained in a thickness direction of each of the single layer structured buffer region 8 (first single layer structured buffer region) and second single layer structured buffer region 82, it is possible to relieve stress in the buffer region 3 and easily realize a thicker filmed semiconductor wafer 1.

In addition, as is shown in FIG. 7, in the case where a plurality of single layer structured buffer regions are sandwiched between the multi-layer structured buffer regions, it is preferred that the single layer structured buffer region approaches the lattice constant of the second layer 7 as it gets further away from the substrate 2, and furthermore, it is preferred that each single layer structured buffer region approaches the lattice constant of the second layer 2 as it gets further away (heading a thickness direction of the semiconductor wafer 1) from the substrate 2.

Figure 8:
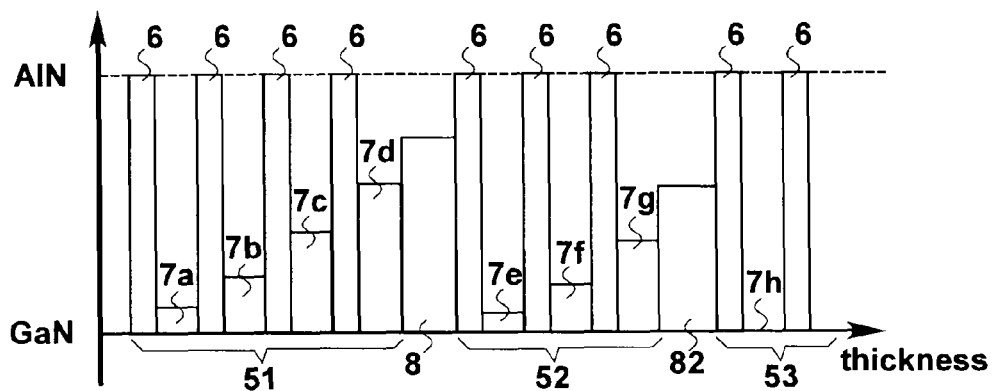
FIG. 8 is a diagram which shows a further example where the proportion of Al contained in a material which forms a single layer structured buffer region in the buffer region of the semiconductor wafer related to the second embodiment of the present invention is changed.

In addition, FIG. 8 shows the composition proportion of Al when the thickness of each layer (first layer 6, second layer 7, single layer structured buffer region 8, second single layer structured buffer region 82) of the buffer region 3 with an upper surface of the substrate 2 as a standard on a horizontal axis is considered. The different point from the example shown in FIG. 7 is the contained proportion of Al in the plurality of second layers 7 which form the first multi-layer structured buffer region 51 and the second multi-layer structured buffer region 52 is changed to a step shape. Specifically, the second layer 7 (7a-7d) which forms the first multi-layer structured buffer region 51 is set to the contained proportion of Al which gradually approaches the lattice constant of the single layer structured buffer region 8 as it gets further away from the substrate 2. In addition, the second layer 7 (7e-7g) which forms the second multi-layer structured buffer region 52 is set to the contained proportion of Al which gradually approaches the lattice constant of the single layer structured buffer region 82 as it gets further away from the substrate 2. Furthermore, the contained proportion of Al of the second layer 7 (7h) which forms the third multi-layer structured buffer region 53 is set smaller than the contained proportion of Al of the second single layer structured buffer region 82.

Because stress which is generated between a multi-layer structured buffer region and a single layer structured buffer region is relieved when the buffer region 3 is structured as is shown in FIG. 8, it is possible to improve crystallization of the single layer structured buffer region and further easily realize a thicker filmed semiconductor wafer 1.

In addition, because the second layer 7 is structured from AlGaN which has a higher resistance than GaN, the buffer region 3 has a higher level of resistance and parasitic capacitance generated in the buffer region 3 can be reduced.

(Third Embodiment)

The semiconductor wafer 1, semiconductor elements and manufacturing method thereof related to the third embodiment of the present invention is as follows.

Figure 9:
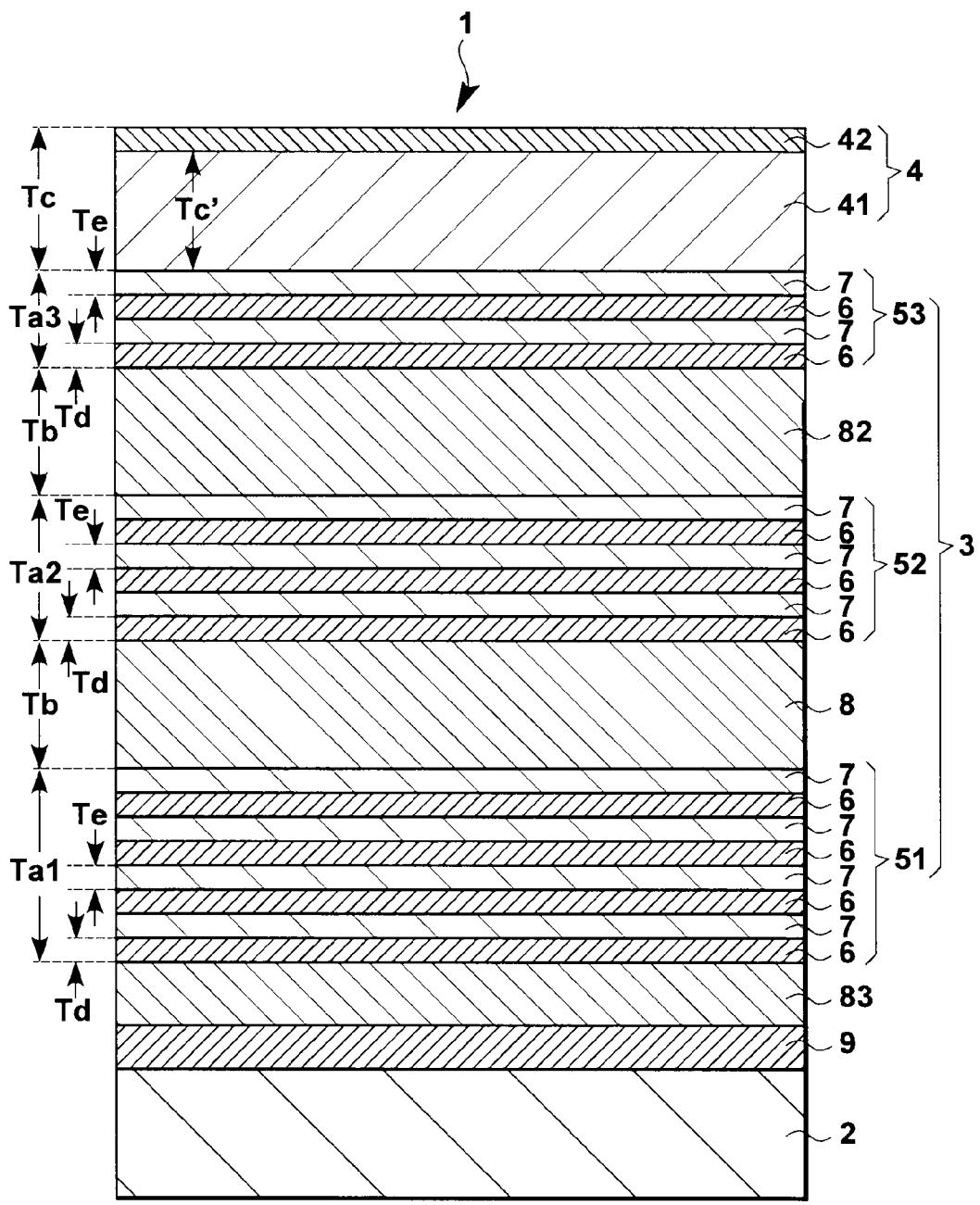
FIG. 9 is a cross sectional diagram which approximately shows a semiconductor wafer related to a third embodiment of the present invention.

As is shown in FIG. 9, a third layer 9 formed thicker than the first layer 6 and a third single layer structured buffer region 83 formed on the third layer 9 between the substrate 2 and buffer region 3 (or multi-layer structured buffer region 51) on the semiconductor wafer 1 shown in FIG. 5 is different in the semiconductor wafer 1 related to the third embodiment. Furthermore, the third layer 8 formed thicker than the first layer 6 and the third single layer structured buffer region 83 may be arranged between the substrate 2 and multi-layer structured buffer region 51 in the semiconductor wafer 1 related to the first embodiment.

The third layer 9 has a lattice constant smaller than the lattice constant of a material which forms the substrate 2 and is formed from a material which has comparatively higher insulation properties than the second layer 7. For example, in the third layer 9, a nitride semiconductor represented by the chemical formula (4) where the proportion of contained Al is a first proportion is used.

$$Al_m M_n Ga_{1-m-n} N \qquad (4)$$

Here, M in the chemical formula (4) is an element selected from at least one among In and B. In addition, m and n are numerical values which satisfy the relational expression below.

$0 < m \leq 1$ $0 \leq n < 1$ $m + n \leq 1$

The third single layer structured buffer region 83 has a lattice constant between a lattice constant of a material which forms the first layer 6 and a lattice constant of a material which forms the second layer 7. For example, in the third single layer structured buffer region 83, a nitride semiconductor represented by the chemical formula (5) where the proportion of contained Al is a fifth proportion between first proportion and second proportion is used.

$Al_c M_d Ga_{1-c-d} N$ (5)

Here, M in the chemical formula (5) is an element selected from at least one among In and B. In addition, c and d are numerical values which satisfy the relational expression below.

$0 < c < 1$ $0 \leq d < 1$ $c + d \leq 1$ $a < c < x$

Here, the third layer 9 is formed using AlN for example, and the third singe layer structured buffer region 82 is formed from AlGaN for example. It is preferred that the contained proportion (fifth proportion) of Al in a material which forms the third single layer structured buffer region 3 is set higher than the contained proportion (third proportion) of Al in a material which forms the single layer structured buffer region 8 and the contained proportion (fourth proportion) of Al in a material which forms the second single layer structured buffer region 82.

(Other Embodiments)

The present invention is not limited to the first to third embodiments described above. For example, the following variations are possible.

(1) The main semiconductor region 4 can be applied as a semiconductor region for forming semiconductor elements other than a HEMT such as MESFET, SBD and LED.

(2) In the case of forming a HEMT in the main semiconductor region 4, n type impurities for example can be added to the electron supply layer 42. In addition, a supporting semiconductor layer such as a cap layer or contact layer can be formed on the electron supply layer 42.

(3) It is possible to form the buffer region 3 and the main semiconductor region 4 using a compound semiconductor other than a nitride semiconductor.

(4) In the buffer region 3 related to the embodiments described above, either Al is included in the first layer 6, third layer 9, and single layer structured buffer regions 8, 82, 83 or Al is not included in the second layer 7 or the proportion of Al in the second layer 7 is set less than the proportion of Al in the first layer 6 and the single layer structured buffer regions 8, 82, 82 in order to apply a difference in the lattice constants to each of the plurality of layers (6, 7, 8, 82, 83, 9). Instead of this, it is possible to form each layer of the buffer region 3 using a different semiconductor material (for example, a material including B or In) which can apply a difference to a lattice constant in the buffer region 3.

(5) An example where the second layer 7 is formed using GaN was explained. However, it is possible to form the second layer 7 using AlGaN which has contained ratio of Al lower than the first proportion. By adopting this type of structure, it is possible to have a second layer 7 with a level of resistance and furthermore, it is possible to relieve stress generated in the buffer region 3 and further reduce parasitic capacitance generated in the buffer region 3.

By the semiconductor wafer, semiconductor elements and manufacturing method thereof related to the present invention, it is possible to reduce stress generated in a in a single layer structured buffer region by arranging the single layer structured buffer region which is formed thicker than a first layer and a second layer which form a multi-layer structured buffer region, between multi-layer structured buffer regions which are stacked with a plurality of alternating first layers and second layers and which is comprised from a compound semiconductor which has a lattice constant between a lattice constant which forms the first layer and a lattice constant of a material which forms the second layer. Furthermore, it is possible to moderate the relief effects of stress generated in the buffer region 3, reduce the generation of piezo polarization caused by stress in the single layer structured buffer region and reduce the generation of a current component in a horizontal direction in the single layer structured buffer region. Therefore, it is possible to reduce parasitic capacitance generated in the buffer region.

What is claimed is:

1. A semiconductor wafer comprising:
   a substrate;
   a buffer region formed on one main surface of the substrate and formed from a compound semiconductor; and
   a main semiconductor region formed on the buffer region and formed from a compound semiconductor;
   wherein
   the buffer region includes a first multi-layer structured buffer region and a second multi-layer structured buffer region and a single layer structured buffer region arranged between the first multi-layer structured buffer region and the second multi-layer structured buffer region, both multi-layer structured buffer regions being stacked with a plurality of alternating first layers and second layers;
   the first layer is formed from a compound semiconductor which has a lattice constant smaller than a lattice constant of a material which forms the substrate;
   the second layer is formed from a compound semiconductor which has a lattice constant between a lattice constant of a material which forms the substrate and a lattice constant of a material which forms the first layer; and
   the single layer structured buffer region is thicker than the first layer and the second layer, and is formed from a compound semiconductor which has a lattice constant between a lattice constant of a material which forms the first layer and a lattice constant of a material which forms the second layer.

2. The semiconductor wafer according to claim 1, further comprising the buffer region includes a third multi-layer structured buffer region and a second single layer structured buffer region, wherein the second multi-layer structured buffer region is arranged between the first single layer structured buffer region and the second single layer structured buffer region, and the second single layer structured buffer region is arranged between the second multi-layer structured buffer region and the third multi-layer structured buffer region.

3. The semiconductor wafer according to claim 2, wherein the lattice constant of the first single layer structured buffer region and the lattice constant of the second single layer structured buffer region are different, and the second single layer structured buffer region arranged on the main semiconductor region side has a composition close to the lattice constant of the second layer compared to the first single layer structured buffer region arranged on the substrate side.

4. The semiconductor wafer according to claim 1, wherein the first single layer structured buffer region has a composition which gradually approaches the lattice constant of the second layer towards the main semiconductor region side compared to the substrate side, within the first single layer structured buffer region.

5. The semiconductor wafer according to claim 1, wherein the substrate is formed from a silicon or silicon related material, the first layer is formed from a nitride semiconductor including aluminum, the second layer is formed from a nitride semiconductor which does not include aluminum or includes a proportion of aluminum less than the first layer, and the first single layer structured buffer region is formed from a nitride semiconductor which includes aluminum in a proportion between the first layer and the second layer.

6. A semiconductor element comprising:
a substrate;
a buffer region formed on one main surface of the substrate and formed from a compound semiconductor;
a main semiconductor region formed on the buffer region and formed from a compound semiconductor; and
an electrode arranged on the main semiconductor region; wherein
the buffer region includes a first multi-layer structured buffer region and a second multi-layer structured buffer region and a first single layer structured buffer region arranged between the first multi-layer structured buffer region and the second multi-layer structured buffer region, both multi-layer structured buffer regions being stacked with a plurality of alternating first layers and second layers;
the first layer is formed from a compound semiconductor which has a lattice constant smaller than a lattice constant of a material which forms the substrate;
the second layer is formed from a compound semiconductor which has a lattice constant between a lattice constant of a material which forms the substrate and a lattice constant of a material which forms the first layer; and
the first single layer structured buffer region is thicker than the first layer and the second layer, and is formed from a compound semiconductor which has a lattice constant between a lattice constant of a material which forms the first layer and a lattice constant of a material which forms the second layer.

7. The semiconductor element according to claim 6, wherein the buffer region includes a third multi-layer structured buffer region and a second single layer structured buffer region, the second multi-layer structured region is arranged between the first single layer structured buffer region and the second single layer structured buffer region, and the second single layer structured buffer region is arranged between the second multi-layer structured buffer region and the third multi-layer structured buffer region.

8. The semiconductor element according to claim 7, wherein the lattice constant of the first single layer structured buffer region and the lattice constant of the second single layer structured buffer region are different, and the second single layer structured buffer region arranged on the main semiconductor region side has a composition close to the lattice constant of the second layer compared to the first single layer structured buffer region arranged on the substrate side.

9. The semiconductor element according to claim 6, wherein the first single layer structured buffer region has a composition which gradually approaches the lattice constant of the second layer towards the main semiconductor region side compared to the substrate side, within the first single layer structured buffer region.

10. The semiconductor element according to claim 6, wherein the substrate is formed from a silicon or silicon related material, the first layer is formed from a nitride semiconductor including aluminum, the second layer is formed from a nitride semiconductor which does not include aluminum or includes a proportion of aluminum less than the first layer, and the first single layer structured buffer region is formed from a nitride semiconductor which includes aluminum in a proportion between the first layer and the second layer.

* * * * *